(12) United States Patent
Bai

(10) Patent No.: US 10,288,700 B2
(45) Date of Patent: May 14, 2019

(54) MAGNETIC SENSOR FOR DETECTING A VERTICAL COMPONENT OF A MAGNETIC FIELD ON THE SURFACE OF A MAGNETIC PATTERN

(71) Applicant: Wuxi Ler Technology Co., Jiangsu (CN)

(72) Inventor: Jianmin Bai, Jiangsu (CN)

(73) Assignee: Wuxi Ler Technology Co., Ltd. (CN)

( * ) Notice: Subject to any disclaimer, the term of this patent is extended or adjusted under 35 U.S.C. 154(b) by 0 days.

(21) Appl. No.: 14/785,267

(22) PCT Filed: Mar. 17, 2014

(86) PCT No.: PCT/CN2014/000280
§ 371 (c)(1),
(2) Date: Oct. 16, 2015

(87) PCT Pub. No.: WO2014/169698
PCT Pub. Date: Oct. 23, 2014

(65) Prior Publication Data

US 2016/0084923 A1     Mar. 24, 2016

(30) Foreign Application Priority Data

Apr. 16, 2013   (CN) .......................... 2013 1 0131459

(51) Int. Cl.
*G01R 33/09* (2006.01)
*G07D 7/04* (2016.01)
*G07D 7/20* (2016.01)

(52) U.S. Cl.
CPC .............. *G01R 33/09* (2013.01); *G07D 7/04* (2013.01); *G07D 7/20* (2013.01)

(58) Field of Classification Search
CPC ............. G01R 33/09; G07D 7/04; G07D 7/20
(Continued)

(56) References Cited

U.S. PATENT DOCUMENTS 5,512,822 A    4/1996  Masuda
6,737,862 B1*  5/2004  Godoy ................... B60R 22/48
                                                324/207.21
(Continued)

FOREIGN PATENT DOCUMENTS

CN    101887604    11/2010
CN    102147453     8/2011
(Continued)

OTHER PUBLICATIONS

International Search Report re PCT/CN2014/000280, dated Jun. 30, 2014, 6 pgs.
(Continued)

*Primary Examiner* — Jay Patidar
(74) *Attorney, Agent, or Firm* — Greenberg Traurig, LLP

(57) ABSTRACT

A magnetic head for detecting a magnetic field on the surface of a magnetic pattern based on a magneto-resistance technology comprises a support (1) and a PCB (Printed Circuit Board) (5) arranged on the support (1), and further comprises horizontal excitation structures (20, 21) used for generating a magnetic field parallel to the surface of the magnetic head; and a magnetic field detection component (4) based on magneto-resistance (MR) elements (R1-R4), the magnetic field detection component is used for detecting the distribution of vertical components of a leakage magnetic field on the surface of a magnetic pattern. The magnetic head can effectively detect magnetic patterns made of soft magnetic materials or hard magnetic materials. The soft magnetic material is magnetized in an in-plane manner by means of the horizontal excitation structures (20, 21), so as to generate a specific leakage magnetic field on the surface of a magnetic pattern. A Wheatstone bridge structure connection based on the MR elements (R1-R4) is adopted to effectively detect the vertical components of such specific leakage magnetic field, thus the features of the magnetic
(Continued)

patterns made of the soft magnetic materials or the hard magnetic materials can be effectively detected.

7 Claims, 4 Drawing Sheets

(58) Field of Classification Search
USPC .................................. 324/207.21, 252, 228
See application file for complete search history.

(56) References Cited

U.S. PATENT DOCUMENTS

| | | | |
|---|---|---|---|
| 7,893,689 B2* | 2/2011 | Ito | G01D 5/147 324/174 |
| 9,035,645 B2* | 5/2015 | Mizutani | G01B 7/003 324/207.2 |
| 2002/0135360 A1* | 9/2002 | Matsukawa | G01B 7/003 324/207.25 |
| 2004/0160220 A1* | 8/2004 | Wendt | G01D 5/145 324/207.21 |
| 2007/0290678 A1* | 12/2007 | Herrmann | G01D 5/147 324/207.21 |
| 2008/0116885 A1* | 5/2008 | Van Zon | G01L 5/223 324/207.21 |
| 2009/0256552 A1* | 10/2009 | Guo | G01B 7/30 324/207.21 |
| 2011/0233277 A1 | 9/2011 | Schutzmann et al. | |
| 2012/0200292 A1* | 8/2012 | Sugihara | B82Y 25/00 324/252 |
| 2013/0127457 A1* | 5/2013 | Musha | B82Y 25/00 324/252 |
| 2013/0154634 A1* | 6/2013 | Momose | G01R 33/0052 324/258 |
| 2014/0312894 A1* | 10/2014 | Bartos | G07D 7/04 324/252 |

FOREIGN PATENT DOCUMENTS

| | | | |
|---|---|---|---|
| CN | 102576477 | 7/2012 | |
| CN | 103226865 | 7/2013 | |
| JP | 2004294215 A | * 10/2004 | |
| WO | WO 2013023781 A2 | * 2/2013 | ............... G07D 7/04 |

OTHER PUBLICATIONS

Li, Huiying, Study on Static Three-dimensional Weak Magnetic Detection System Based on Labview China Master's Theses Full-text Database, Engineering Technology & Management II, vol. 2010, No. 10, Oct. 15, 2010, pp. 89.

* cited by examiner

MAGNETIC SENSOR FOR DETECTING A VERTICAL COMPONENT OF A MAGNETIC FIELD ON THE SURFACE OF A MAGNETIC PATTERN

CROSS REFERENCE TO RELATED APPLICATION

The present application is a 371 U.S. National Stage of International Application No. PCT/CN2014/000280, filed Mar. 17, 2014, which claims the benefit of the earlier filing date of Chinese Patent Application No. 201310131459.0 filed on Apr. 16, 2013, which are each incorporated herein by reference in their entirety.

FIELD OF INVENTION

The present invention relates to a magnetic head for detecting the magnetic field on the surface of a magnetic pattern based on magneto-resistance technology.

BACKGROUND OF THE INVENTION

In the field of magnetic anti-counterfeiting of banknotes, recording head technology, magneto-resistance (MR) head technology and giant magneto-resistance (GMR) effect technology are mainly used in the current market; in the field of anti-counterfeiting of bills, recording head technology is mainly adopted.

Recording head technology: This recording head uses permalloy or other soft magnetic materials to make a ring structure, which has a gap and is wrapped with a coil. When the air gap of the ring structure quickly passes the surface of a magnetic pattern, induced current will be generated inside the coil based on Faraday's law of electromagnetic induction. By detecting the changes of induced current, the changes of the magnetic field on the surface of the magnetic pattern are known. Main disadvantages of this technology are: 1. It is more suitable to detecting magnetic field on the surface of a hard magnetic material. When it detects soft magnetic material, a background field needs to be added, but this background field will affect the sensitivity of the magnetic head to a great extent; 2. When multichannel heads are made, it is very difficult to assure uniformity of sensitivity in all channels, resulting in a low yield rate and high mass production cost; 3. The recording head has very low immunity from interference of external magnetic fields and requires necessary magnetic shielding against various kinds of interference sources in a complex working environment. This raises the cost of subsequent application products on the one hand and the design difficulty of subsequent application products on the other hand; 4. The output amplitude of signals is relevant with the speed of the recording head relative to the detected magnetic pattern, which adding difficulty to quantitative analysis of signals; 5. Under the condition that some magnetic fields exist indeed, but they don't have a large spatial difference, the actual output of the magnetic head is very small and the magnetic fields may not be detected.

Magneto-resistive head technology: This magnetic head uses InSb or other magneto-resistive materials. Two magneto-resistors are used to constitute a Wheatstone half-bridge. They have spatial location difference in a plane. By detecting the difference between the magnetic field strength on the two magneto resistors, the magnetic field gradient on the surface of the magnetic pattern is detected. Disadvantages of this technology: 1. In this technology, a bias magnetic field must be added in the vertical direction of the magneto-resistive elements so that magneto-resistive elements can work. Meanwhile, as the soft magnetic pattern needs to be magnetized perpendicular to the surface, the needed magnetic field is very large in general. In order to generate this magnetic field, permanent magnets with strong magnetism are needed to reduce magnetism attenuation, but the inevitability of magnetism attenuation results in possible changes of MR sensitivity. In other words, with the increase of time, the sensitivity of the magnetic head may be changed. 2. The sensitivity of MR elements is low, in the range of 0.2 mV/V/Gs-1 mV/V/G in general. This requires a large amplification factor of the subsequent signal processing circuit when a weak magnetic field is measured (in general, the magnetic field strength of soft magnetic pattern on banknotes is low). 3. MR elements are noisy. During detection of weak magnetic field signals, sophisticated frequency-locking and amplification technologies are needed. As a result, the detectable frequency of the magnetic field signals is limited to some extent. 4. As it adopts a half-bridge structure, it has limited immunity from interference of power supply fluctuations and external coupling signals and requires necessary magnetic shielding against various kinds of interference sources in a complex working environment. This raises the cost of subsequent application products on the one hand and the design difficulty of subsequent application products on the other hand. 5. When the magnetic head is multi-channel structure, it is very difficult to assure the uniformity of sensitivity of all channels, resulting in a low yield rate and high mass production cost. 6. As the design adopts a gradiometer, only the spatial gradient of the vertical component of the magnetic field can be identified and the actual distribution of the magnetic field cannot be measured. Under the condition that some magnetic fields exist indeed, but they don't have a large spatial difference, the actual output of the magnetic head is very small and the magnetic fields may not be detected.

GMR technology: This technology may adopt a thin-film process. The sensing axis is in the thin film's plane. The magnetic head based on this technology is realized mainly by two methods: In one method, two GMR resistors are prepared on the substrate. The sensing axises of the two GMR resistors may be consistent or opposite. The two GMR resistors are connected into a form of Wheatstone half-bridge. The plane where the two placed GMR resistors are parallel with the plane where the magnetic pattern to be detected is located. Meanwhile, the relative positions of the two placed GMR resistors may be parallel with or perpendicular to the moving direction of the magnetic pattern. These two methods are both used to detect the gradient value of the in-plane component of magnetic field on the surface of the magnetic pattern in the arrangement direction of the two in-plane GMR resistors. Advantages of this technology are: As a thin-film process is adopted, the uniformity of the products can be easily assured. Disadvantages of this technology are: 1. As gradient detection method is adopted, the actual distribution of the magnetic field cannot be directly measured. Under the condition that some magnetic fields exist indeed, but they don't have a large spatial difference, the actual output of the magnetic head is very small and the magnetic fields may not be detected. 2. As it adopts a half-bridge structure, it has limited immunity from interference of power supply fluctuations and external coupling signals and requires necessary magnetic shielding against various kinds of interference sources in a complex working environment. This raises the cost of subsequent application products on the one hand and the design difficulty of subsequent application products on the other hand.

SUMMARY OF THE INVENTION

The object of the present invention is to provide a magnetic head for detecting a soft magnetic pattern based on magneto-resistance technology, which can accurately measure actual size of the vertical component of a magnetic field. The magnetic head tackles the defects of prior art and provides a possibility for quantitative analysis of the magnetic field on the surface of the magnetic pattern.

In order to realize the foregoing object, the present invention adopts the following technical solution: a magnetic head for detecting a magnetic field on the surface of a magnetic pattern based on magneto-resistance technology, comprising a frame and a PCB (Printed Circuit Board) arranged on the frame, and further comprising a permanent magnets structure for generating a background field parallel with the surface of the magnetic head; and a magnetic sensor based on magneto-resistive (MR) elements, which is used for detecting the distribution of the vertical component of a magnetic field on the surface of the magnetic pattern.

Further, the permanent magnets structure is a structure that two front and back horizontally magnetized permanent magnets placed in front of and behind the magnetic sensor along the magnetization direction.

Further, the permanent magnets structure is a structure that two front and back vertically magnetized permanent magnets reversely placed in the symmetric positions in front of and behind the magnetic sensor along the vertical direction of the magnetization direction.

Further, the permanent magnets structure is a structure that a horizontally magnetized permanent magnet placed at the front/rear end of the magnetic sensor, and a soft magnetic material block placed at rear/front end of the magnetic sensor.

Further, the magnetic sensor is a Wheatstone bridge structure composed of a plurality of MR elements.

Further, the Wheatstone bridge structure is a Wheatstone full-bridge structure or a Wheatstone half-bridge structure.

Further, when the Wheatstone bridge structure is a Wheatstone full-bridge structure, two magneto-resistors therein are close to the surface of the magnetic head and another two magneto-resistors are far from the surface of the magnetic head; when the Wheatstone bridge structure is a Wheatstone half-bridge structure, an magneto-resistor therein is close to the surface of the magnetic head, and another magneto-resistor is far from the surface of the magnetic head.

Further, the sensing axises of the MR elements are consistent and perpendicular to the surface of the magnetic head.

Further, the MR elements are at least one kind of anisotropic magneto-resistive (AMR) elements, or giant magneto-resistive (GMR) elements or tunneling magneto-resistive (TMR) elements.

Beneficial effects of the present invention: (1) The present invention adopts magneto-resistance technology which has extremely high sensitivity, making the subsequent signal processing circuits relatively simple. By mean of permanent magnets structure, a background field can be directly added to the detected position. As the magnetic pattern is in a form of thin chip macroscopically, its easy magnetization axis is in a horizontal direction and the needed background field is small, and thus the permanent magnets needed for generating this magnetic field can be cheap ferrite materials. The present application effectively lowers the production cost, and improves the thermal stability of the permanent magnets.

(2) The present invention may effectively detect a magnetic pattern made of soft magnetic materials. The soft magnetic materials are magnetized in plane and a specific magnetic field is generated on the surface of the magnetic pattern through permanent magnets structure; the Wheatstone bridge circuit structure composed of MR elements, which is used for detecting in a vertical direction, may effectively detect the vertical component of magnetic field on the surface of a magnetic pattern and truly reflect the real condition of the magnetic field on the surface of the magnetic pattern, thus effectively detecting the characteristics of the magnetic pattern made of soft magnetic materials, and providing a possibility for quantitative analysis of magnetic field on the surface of the magnetic pattern. The miss detection of the existing magnetic head is prevented in the case that a magnetic field exists indeed, but the in-plane spatial gradient of the magnetic field is small.

(3) The present invention adopts a Wheatstone full-bridge structure and the four magneto-resistors therein have a same sensing axis, so it has very good immunity from interference of external electromagnetic fields.

DETAILED DESCRIPTION OF THE EMBODIMENTS

Figure 1:
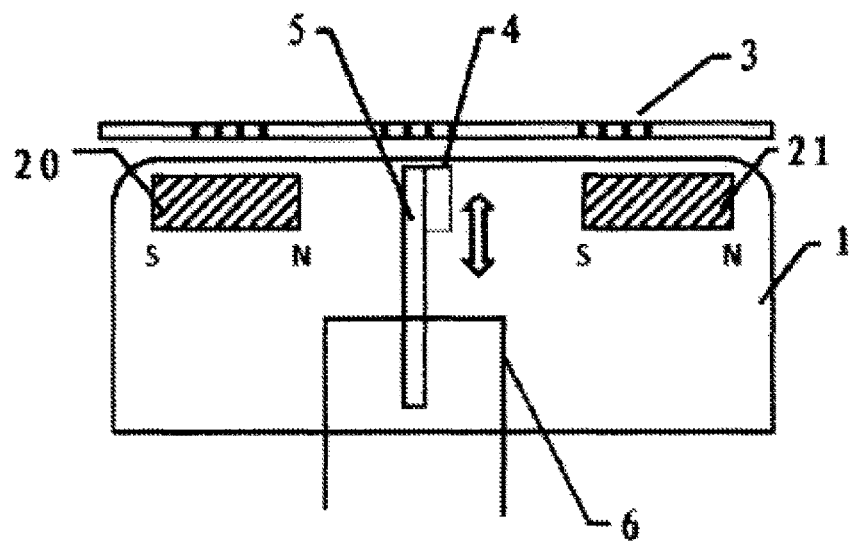
FIG. 1 is a schematic diagram of the first permanent magnets structure of the present invention.
Figure 2:
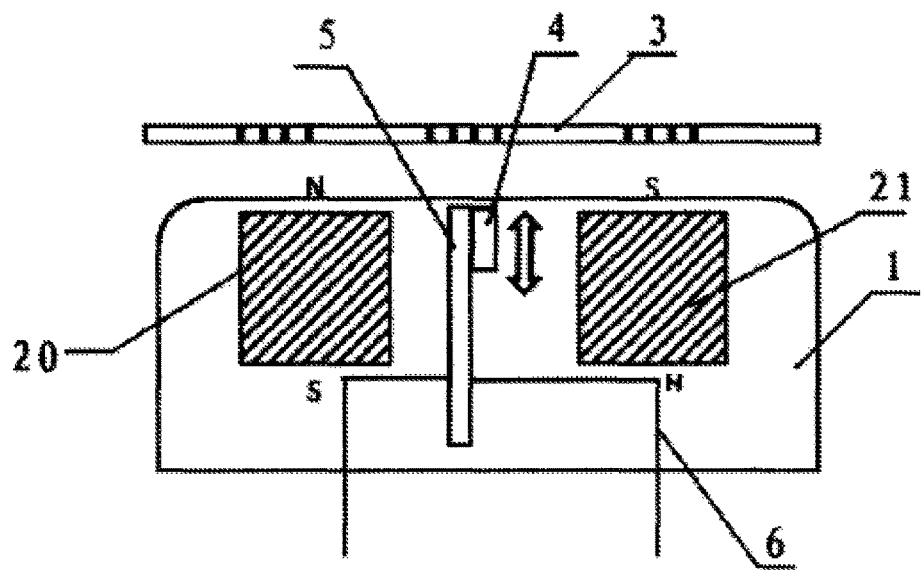
FIG. 2 is a schematic diagram of the second permanent magnets structure of the present invention.
Figure 3:
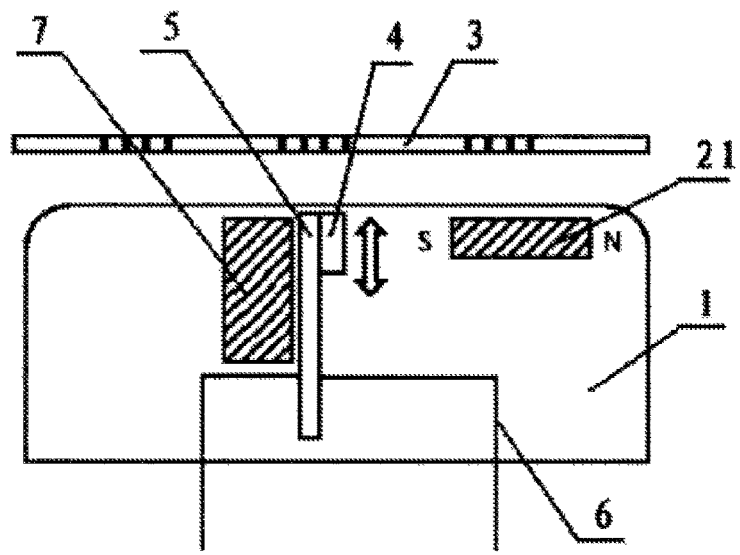
FIG. 3 is a schematic diagram of the third permanent magnets structure of the present invention.

FIG. 1 to FIG. 3 show a magnetic head for detecting a magnetic field on the surface of a magnetic pattern 3 based on magneto-resistance technology, comprising a frame 1 and a PCB (Printed Circuit Board) 5 arranged on the frame, and further comprising permanent magnets structure for generating a background field parallel with the surface of the magnetic head; the background field can magnetize the magnetic pattern made of soft magnetic materials. After the magnetic pattern is magnetized, a specific distribution 6 of the magnetic field will be generated on its surface. The value of this magnetic field decreases dramatically with the increase of distance D1, D2, D3, D4 from the surface of the magnetic pattern; and a magnetic sensor based on magneto-resistive (MR) elements, which is used for detecting the distribution of the vertical component of a magnetic field on the surface of the magnetic pattern.

The permanent magnets structure can be realized by various methods:

In FIG. 1, the permanent magnets structure are two front and back horizontally magnetized permanent magnets 20 and 21 placed in front of and behind the magnetic sensor 4 along the magnetization direction.

In FIG. 2, the permanent magnets structure are two front and back vertically magnetized permanent magnets 20 and 21 reversely placed in the symmetric positions in front of and behind the magnetic sensor 4 along the vertical direction of the magnetization direction.

In FIG. 3, the permanent magnets structure include a horizontally magnetized permanent magnet 21 placed at the front/rear end of the magnetic sensor 4, and a soft magnetic material block 7 placed at rear/front end of the magnetic sensor 4. Apart from the above, there are also many other methods by which an background field in the horizontal direction can be obtained.

Figure 4:
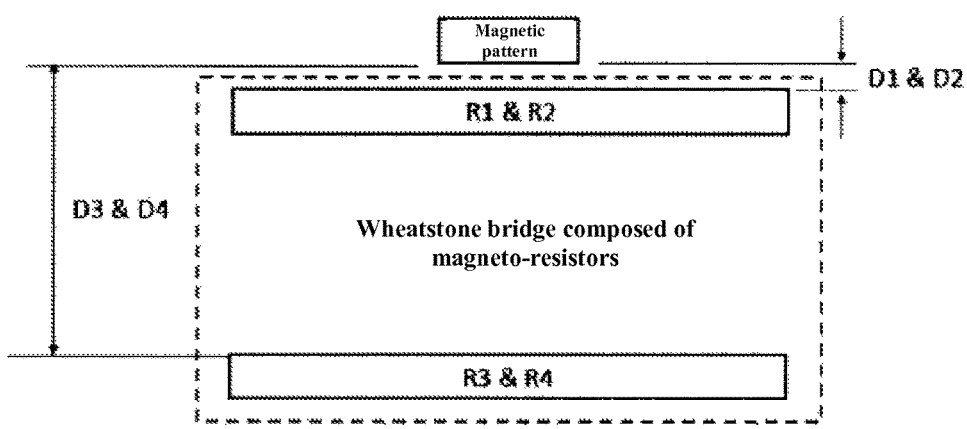
FIG. 4 is a schematic diagram of the Wheatstone bridge structure of the present invention.

As shown in FIG. 4, the magnetic sensor is a Wheatstone bridge structure composed of a plurality of MR elements. The sensing axises of the MR elements therein are consistent and perpendicular to the surface of the magnetic head. The MR elements are at least one kind of anisotropic magneto-resistive (AMR) elements, or giant magneto-resistive (GMR) elements or tunneling magneto-resistive (TMR) elements. When the Wheatstone bridge structure is a Wheatstone full-bridge structure, two magneto-resistors are close to the surface of the magnetic head and another two magneto-resistors are far from the surface of the magnetic head; when the Wheatstone bridge structure is a Wheatstone half-bridge structure, a magneto-resistor is close to the surface of the magnetic head, and another magneto-resistor is far from the surface of the magnetic head.

Figure 5:
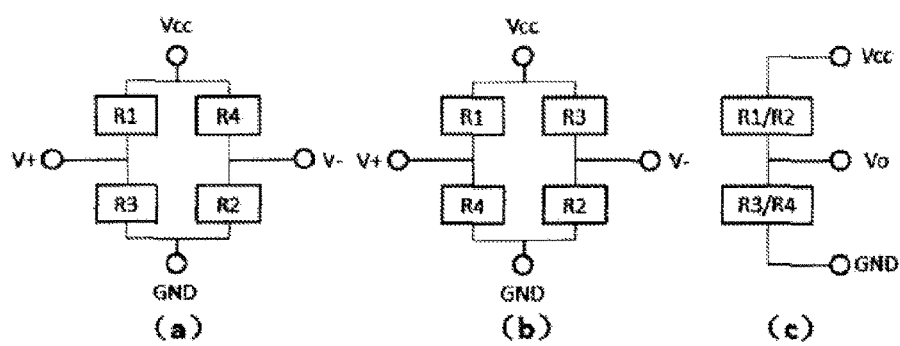
FIG. 5 is a schematic diagram for connection of the three bridge circuit of the Wheatstone bridge structure of the present invention.

FIG. 5 is a specific embodiment: a magneto-resistor R1/R2 (half bridge) or two magneto-resistors R1 and R2 (full bridge) are close to the surface of the magnetic head; another magneto-resistor R3/R4 (half bridge) or two magneto-resistors R3 and R4 (full bridge) are far from the surface of the magnetic head. These MR elements are connected together in form of a Wheatstone full-bridge or Wheatstone half-bridge structure (refer to the three connecting methods of bridge circuits a, b and c in FIG. 5). As the amplitude of magnetic field felt by the magneto-resistor close to the surface of the magnetic head is much greater than the amplitude of magnetic field felt by the magneto-resistor far from the surface of the magnetic head and the magnetic field of the latter is nearly zero, the magnetic sensor 4 can detect the ture distribution of the vertical component of the magnetic field on the surface of the magnetic pattern.

Figure 6:
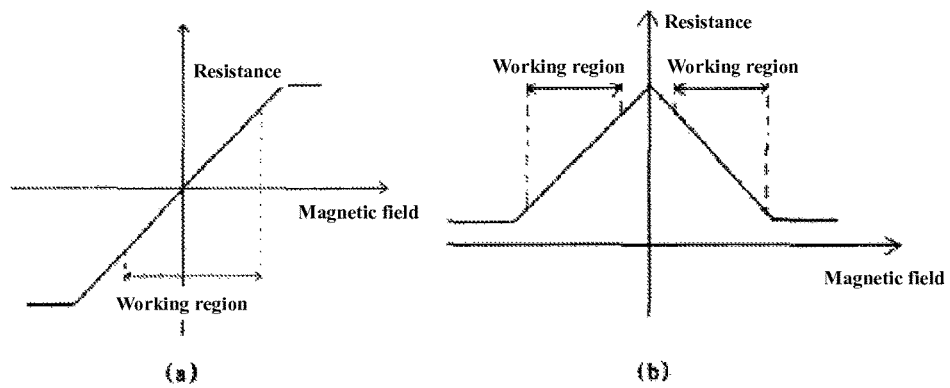
FIG. 6 is a distribution curve of the magnetic field of the present invention.

FIG. 6 shows a curve of changes of resistance of MR elements with the external magnetic field. There are two types: 1. When the external magnetic field is smaller than the saturation field, the resistance of the MR elements is changed linearly with the external magnetic field, which is called "linear MR elements"; 2. When the external magnetic field is smaller than the saturation field, the curve of changes of resistance of MR elements with the external magnetic field is a curve in an inverted "V" shape, which is called "V-shaped MR elements". Due to the effect of the error of relative positions of magnets and MR elements, and the processing error of the magnets and other factors, there may be a magnetic field of certain intensity in the MR element's sensing axis, but this magnetic field can be controlled within the working region of MR elements. For linear MR elements, permanent magnets are arranged symmetrically to MR elements to make the working region of MR elements are close to zero (refer to magnetic field distribution curve 6a); for V-shaped MR elements, the asymmetry of the positions of the permanent magnets relative to MR elements may be adjusted to some extent to adjust the working region of MR to the positive region or negative region (refer to magnetic field distribution curve 6b).

Figure 7:
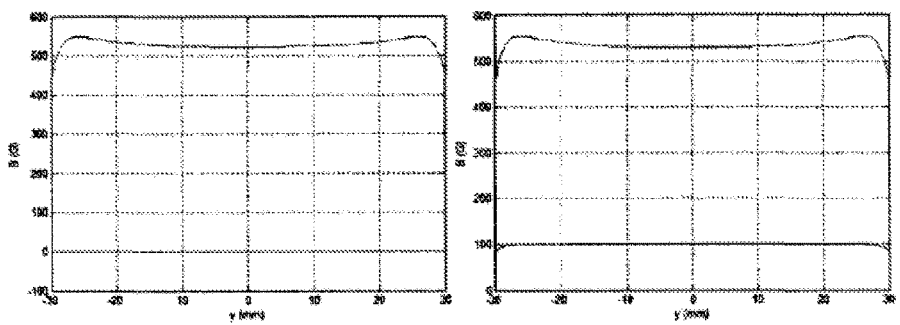
FIG. 7 is a distribution curve of MR elements of the present invention in a magnetic field.

FIG. 7 shows the distribution of two components of the MR elements in the magnetic field: FIG. 7a shows the distribution when linear MR elements are in the magnetic field; FIG. 7b shows the distribution when V-shaped MR elements are in the magnetic field.

The foregoing embodiment is only a preferred embodiment of the present invention and not to limit the present invention. All the modifications, equivalent replacements and improvements made without departing from the spirit and principle of the invention shall be in the protective scope of the invention.

The invention claimed is:

1. A magnetic head for detecting a magnetic field on the surface of a magnetic pattern based on magneto-resistance technology, the magnetic head comprising:
   a frame;
   a printed circuit board (PCB) mounted on the frame, the PCB including a processor connected to a magnetic sensor;
   a permanent magnet structure for generating a magnetic field parallel to a top surface of the magnetic head, the permanent magnet structure comprising a first horizontally magnetized permanent magnet placed at a first side of the magnetic sensor along the magnetization direction and a second horizontally magnetized permanent magnet placed at a second side of the magnetic sensor, each of the first and second permanent magnets, each with a magnetic axis between its poles, being arranged such that the magnetic axis of each of the first and second permanent magnets is parallel to the top surface of the magnetic head;
   the magnetic sensor being electrically coupled to the PCB and mounted to the frame, the magnetic sensor comprising magneto-resistive (MR) elements, wherein the magnetic sensor detects a magnetic distribution of a vertical component of the magnetic field on the surface of the magnetic pattern generated when the magnetic pattern passes proximate to the magnetic sensor and transmits the magnetic distribution to the processor; and
   wherein the processor determines a type of target magnetic material in the magnetic pattern, the type of the target magnetic material being derived from the detected magnetic distribution of the vertical component of the magnetic field on the surface of the magnetic pattern formed in a traveling direction, wherein the magnetic field of the first and second horizontally magnetized permanent magnets remain unchanged.

2. The magnetic head for detecting a magnetic field on the surface of a magnetic pattern based on magneto-resistance technology as in claim 1, wherein the magnetic sensor is a Wheatstone bridge structure.

3. The magnetic head for detecting a magnetic field on the surface of a magnetic pattern based on magneto-resistance technology as in claim 2, wherein the Wheatstone bridge structure is a Wheatstone full-bridge structure or a Wheatstone half-bridge structure.

4. The magnetic head for detecting a magnetic field on the surface of a magnetic pattern based on magneto-resistance technology as in claim 3, wherein when the Wheatstone bridge structure is a Wheatstone full-bridge structure, two of the magneto-resistive (MR) elements therein are close to the top surface of the magnetic head and another two of the magneto-resistive (MR) elements are far from the top surface of the magnetic head; and when the Wheatstone bridge structure is a Wheatstone half-bridge structure, one of the magneto-resistive (MR) elements therein is close to the top surface of the magnetic head, and another one of the magneto-resistive (MR) elements is far from the top surface of the magnetic head.

5. The magnetic head for detecting a magnetic field on the surface of a magnetic pattern based on magneto-resistance technology as in claim 4, wherein the sensing axes of the MR elements are consistent and perpendicular to the top surface of the magnetic head.

6. The magnetic head for detecting a magnetic field on the surface of a magnetic pattern based on magneto-resistance technology as in claim 5, wherein the MR elements are at least one of an anisotropic magneto-resistive (AMR) element, a giant magneto-resistive (GMR) element, or a tunneling magneto-resistive (TMR) element.

7. A magnetic head for detecting a magnetic field on the surface of a magnetic pattern based on magneto-resistance technology, the magnetic head comprising:
   a frame;
   a printed circuit board (PCB) mounted on the frame, the PCB including a processor connected to a magnetic sensor;
   a permanent magnet structure for generating a magnetic field parallel to a top surface of the magnetic head, the permanent magnet structure comprising a first vertically magnetized permanent magnet placed at a first side of the magnetic sensor and a second vertically magnetized permanent magnet placed at a second side of the magnetic sensor, each of the first and second permanent magnets, each with a magnetic axis between its poles, being arranged such that the magnetic axis of each of the first and second permanent magnets is perpendicular to the top surface of the magnetic head;
   the magnetic sensor being electrically coupled to the PCB and mounted to the frame, the magnetic sensor comprising magneto-resistive (MR) elements, wherein the magnetic sensor detects a magnetic distribution of a vertical component of the magnetic field on the surface of the magnetic pattern generated when the magnetic pattern passes proximate to the magnetic sensor and transmits the magnetic distribution to the processor; and
   wherein the processor determines a type of target magnetic material in the magnetic pattern, the type of the target magnetic material being derived from the detected magnetic distribution of the vertical component of the magnetic field on the surface of the magnetic pattern formed in a traveling direction, wherein the magnetic field of the first and second horizontally magnetized permanent magnets remain unchanged.

* * * * *